(12) United States Patent
Ono et al.

(10) Patent No.: US 6,187,120 B1
(45) Date of Patent: Feb. 13, 2001

(54) METHOD OF MANUFACTURING COMPOSITE MAGNETIC SHEET

(75) Inventors: Norihiko Ono, Yokohama; Shigeyoshi Yoshida, Abiko; Osamu Ito, Akita; Mitsuharu Sato, Yokohama, all of (JP)

(73) Assignee: Tokin Corporation, Miygai (JP)

( * ) Notice: Under 35 U.S.C. 154(b), the term of this patent shall be extended for 0 days.

(21) Appl. No.: 09/068,144

(22) PCT Filed: Sep. 2, 1997

(86) PCT No.: PCT/JP97/03068

§ 371 Date: May 1, 1998

§ 102(e) Date: May 1, 1998

(87) PCT Pub. No.: WO98/09788

PCT Pub. Date: Mar. 12, 1998

(30) Foreign Application Priority Data

| Sep. 3, 1996 | (JP) | 8-233327 |
| Sep. 9, 1996 | (JP) | 8-237995 |
| Sep. 9, 1996 | (JP) | 8-237996 |
| Sep. 13, 1996 | (JP) | 8-243710 |
| Sep. 30, 1996 | (JP) | 8-258310 |

(51) Int. Cl.⁷ ............................................. B32B 31/00
(52) U.S. Cl. .......................... 156/62; 156/209; 156/219; 156/242; 156/324
(58) Field of Search .................. 156/73.5, 242, 156/324, 62.2, 209, 219

(56) References Cited

U.S. PATENT DOCUMENTS

| 4,277,298 | 7/1981 | L'Allemand | 156/199 |
| 4,923,533 | 5/1990 | Shigeta et al. | 148/304 |
| 5,770,304 | * 6/1998 | Nakamura et al. | 428/328 |
| 5,827,445 | * 10/1998 | Yoshida et al. | 252/62.54 |
| 5,864,088 | * 1/1999 | Sato et al. | 174/35 MS |

FOREIGN PATENT DOCUMENTS

| 56-110205 | 11/1981 | (JP) . |
| 002085119 | 7/1982 | (JP) . |
| 06218836 | * 8/1994 | (JP) . |
| 06232587 | * 8/1994 | (JP) . |
| 07038274 | * 2/1995 | (JP) . |
| 07212079 | * 8/1995 | (JP) . |
| 08008582 | * 1/1996 | (JP) . |
| 08083994 | * 3/1996 | (JP) . |

* cited by examiner

*Primary Examiner*—James Sells
(74) *Attorney, Agent, or Firm*—Hopgood, Calimafde, Kalil & Judlowe

(57) ABSTRACT

A mixture of flat soft magnetic powder and an organic binding agent is rolled by mutually confronting of rolls so as to produce a composite magnetic sheet excellent in electromagnetic wave absorption characteristic. A plurality of the composite magnetic sheets are stacked by forming groove surfaces on each of said plurality of sheets and rolled to a desired thickness. By sandwiching a conductive mesh metal layer between two of said composite magnetic sheets and joining them by applying rolling pressure thereto, a mechanically strong electromagnetic interference suppressing sheet can be easily obtained. In order to reduce reflection and transmittance of electromagnetic waves of the composite magnetic sheet, embossing is applied to obverse and reverse surfaces of the composite magnetic sheet.

10 Claims, 4 Drawing Sheets

METHOD OF MANUFACTURING COMPOSITE MAGNETIC SHEET

This application is a 371 of PCT/JP97/03068 filed Sep. 2, 1997.

TECHNICAL FIELD

The present invention relates to a method of producing a composite magnetic sheet formed by mixing soft magnetic powder into an organic binding agent and, in particular, to a method of producing a composite magnetic sheet for use in an electromagnetic interference suppressing body.

BACKGROUND ART

An electromagnetic interference suppressing body is used for suppressing electromagnetic interference caused by interference of undesired electromagnetic waves.

Conventionally, for blocking invasion of the external undesired electromagnetic waves into an electronic device, shielding of the electronic device by a conductor has been carried out. However, since the blocking of the electromagnetic waves by the conductor aims to reflect the electromagnetic waves, radiant waves from a certain component within the electronic device may be reflected to adversely affect other components in the same electronic device as secondary noise. Particularly, following reduction in size and increase in working frequency of electronic devices in recent years, problems of the interference due to the external electromagnetic waves and the secondary noise due to the internal electromagnetic waves are serious.

JP-A-7-212079 discloses a composite magnetic body which can suppress interference of undesired electromagnetic waves utilizing absorption of highfrequency waves due to a complex permeability of a soft magnetic body of a certain kind. This composite magnetic body is constituted of a composite magnetic sheet formed by mixing soft magnetic powder into an organic binding agent.

The sheet of the composite magnetic body may be used as it is. On the other hand, by forming a structure stacked with a conductive sheet, the coming electromagnetic waves are absorbed by the composite magnetic sheet and the electromagnetic waves passing through the composite magnetic sheet are reflected by the conductive sheet into the composite magnetic sheet, so as to suppress the interference of the undesired electromagnetic waves.

Such an electromagnetic interference suppressing body is disposed, for example, on the surface of an electronic device or around an electronic component in the electronic device which is liable to be adversely affected by external electromagnetic waves. Alternatively, it maybe used for positioning it between two printed circuit boards each having mounted thereon with electronic components confronting each other with a space therebetween.

Incidentally, the foregoing composite magnetic sheet has been produced by hot pressing a kneaded slurry material in the form of soft magnetic powder and an organic binding agent suspended and dispersed in an organic solvent.

A drawback with this method is that when the composite magnetic sheets are produced by the hot pressing, entrainment of the air into the composite magnetic sheets occurs, whereby the yield of acceptable composite magnetic sheets is adversely affected.

Further, since the method of hot pressing is a batch process, it is unsuitable for the mass production.

On the other hand, an absorption capacity of undesired electromagnetic waves of the composite magnetic body is determined by a thickness thereof assuming that a material to be used is the same.

Therefore, an object of the present invention is to provide method which for the mass production of composite magnetic sheets of a required thickness.

Another object of the present invention is to provide a method of producing a composite magnetic sheet of highquality with less entrained air.

Further, another object of the present invention is to provide a method of producing a composite magnetic sheet which, in view of the shape thereof, reduces reflected components and transmitting components and improves the absorption rate of electromagnetic waves.

Another object of the present invention is to provide a method of producing an electromagnetic interference suppressing sheet having a stacked structure of composite magnetic sheets and a conductor layer resistant to mechanical exfoliation.

DISCLOSURE OF THE INVENTION

According to the present invention, as described and claimed herein claim 1, there is obtained a method is provided for producing a composite magnetic sheet the steps of preparing a powdered mixture of soft magnetic powder and an organic binding agent; and of rolling the foregoing powdered mixture by feeding the mixture between two two spaced rolls to to produce the composite magnetic sheet as as claimed.

Further, claimed, an electromagnetic interference suppressing body using the composite magnetic sheets produced by the foregoing method of the present invention can be produced as a stacked sheet by sandwiching a conductive sheet having a plurality of holes between the two composite magnetic sheets and attaching these sheets under pressure by passing the sheets as a stack through a gap of two rolls.

BEST MODE FOR CARRYING OUT THE INVENTION

Now, embodiments of the present invention will be explained with reference to the drawings.

Figure 1:
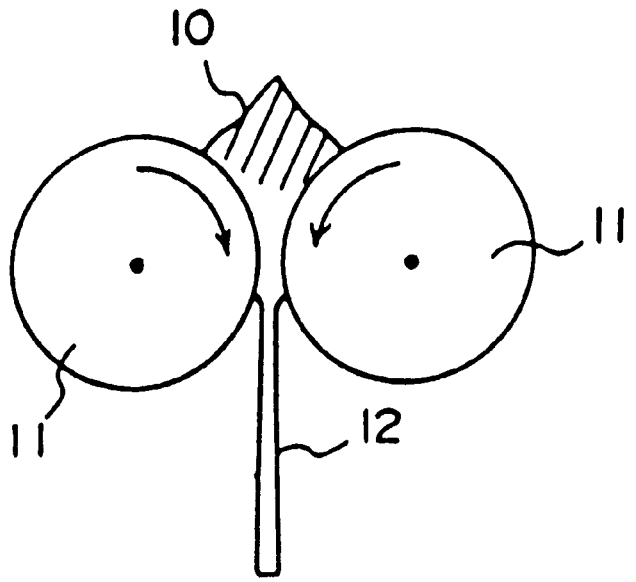
FIG. 1 is a diagram illustrating a method of producing a composite magnetic sheet according to a first embodiment of the present invention.

Referring to FIG. 1, which relates to a method of producing a composite magnetic sheet according to one embodiment of the present invention, a mixture of soft magnetic powder and an organic binding agent is ground and classified to provide a mixture 10 of the soft magnetic powder and the organic binding agent. The soft magnetic powder is preferably processed into a flat shape. The organic binding agent may, for example, be an elastomer such as chlorinated polyethylene.

Then atomized mixture 10 is then fed between two mutually confronting rolling rolls 11 and rolled to obtain a composite magnetic sheet 12.

The composite magnetic sheet 12 is cut into a desired shape, for example, using it, for application to an electronic device so as to be mounted on the electronic device.

Preferably, a mixture having a particle sizes smaller than the thickness of the composite magnetic sheet 12 to be produced is used as the atomized mixture 10, and the atomized mixture 10 is rolled through the two confronting rolling rolls 11 with a gap therebetween substantially equal to the desired thickness of the composite magnetic sheet 12 to be produced.

As described above, by controlling the particle size of the atomized mixture 10 to the desired size prior to the rolling process air entrainment into the composite magnetic sheet 12 is substantially avoided to assure a high-quality composite magnetic sheet.

Further, by subjecting the atomized mixture 10 to the rolling process through the two rolling rolls 11, the atomized mixture 10 including the flat soft magnetic powder can be oriented during the rolling process between the two rolling rolls 11 such that the flat soft magnetic powder becomes parallel to the surface of the composite magnetic sheet 12. By this method, deterioration of a transmittance characteristic due to a diamagnetic field can be prevented so that the composite magnetic sheet 12 has high quality.

Figure 2:
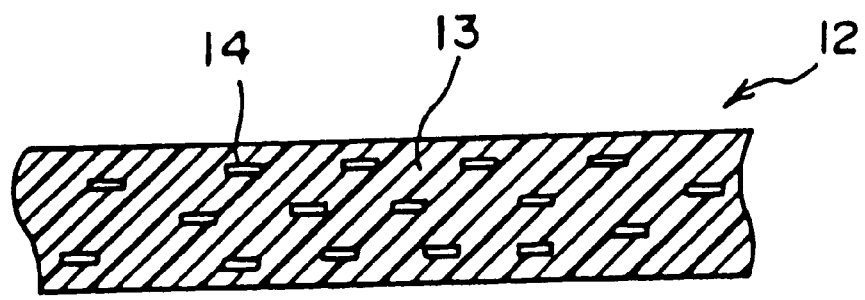
FIG. 2 is a sectional view of the composite magnetic sheet produced by the method illustrated FIG. 1.

FIG. 2 is a sectional view of the composite magnetic sheet 12 showing the flat soft magnetic powder 14 dispersed in a layer 12 of said organic binding agent. The powder is oriented so as to be parallel to the surface of the resulting composite magnetic sheet 12.

Figure 3:
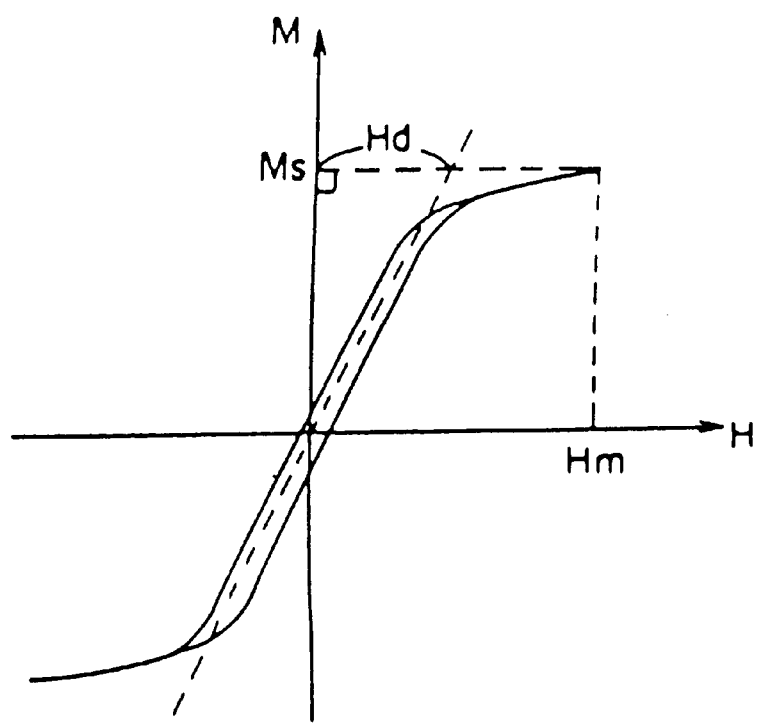
FIG. 3 is a diagram for explaining a diamagnetic field of the composite magnetic sheet produced by the method of FIG. 1.

Here, "a diamagnetic field" Hd will be explained with reference to FIG. 3.

A composite magnetic sample formed into a cubic shape is marked for observation of magnetic particle orientation direction. Using a VSM (vibrating type magnetometer), M-H curves (magnetization curves) in an orientation direction of the magnetic particles (magnetization easy axis direction) and a direction perpendicular to the orientation direction (magnetization hard axis direction) are derived, respectively, with respect to the cubic sample. FIG. 3 shows the M-H curve. A line (note dotted line in FIG. 3) passing the origin is drawn parallel to a linear region of the obtained M-H curve, and a magnetic field corresponding to an intersection point between this line and an Ms line (saturation magnetization line) is set to be "a diamagnetic field" Hd.

A diamagnetic field in "the magnetization easy axis direction" is represented by Hde, while a diamagnetic field in "the magnetization hard axis direction" is represented by Hdd.

It was confirmed that the composite magnetic sheet produced by the method of FIG. 1 resulted a ratio Hdd/Hde of not less than 4.

With regard to the soft magnetic powder, an Fe—Al—Si alloy (trademark: Sendust) or an Fe—Ni alloy (Permalloy) can be used.

On the other hand, as the organic binding agent, thermoplastic resin can be used, such as polyester resin, chlorinated polyethylene resin, polyvinyl chloride resin, polyvinyl butyral resin, polyurethane resin, cellulose resin, nitrile-butadiene rubber or stylene-butadiene rubber, or a polymer thereof.

Some of these organic binding agents may generate heat to be self-fused due to friction during rolling by the foregoing two rolls. The degree thereof also depends on a rotational speed of the rolls or a gap between the two rolls. For those with small self-fusing degrees or those with no self fusion, heating rolls may be used as the rolls to cause the self fusion.

It may be stated that a composite magnetic sheet of a desired thickness need not be produced through a single rolling step, but the rolling process may be divided into stages and be carried out several times. Specifically, a sheet obtained through one rolling process is further passed under pressure between two rolls with a reduced gap therebetween so that a thin sheet can be obtained if desired. On the contrary, a plurality of sheets, such as two, composite magnetic sheets each produced through one rolling process maybe passed as a stack between two rolls so as to be attached or joined with each other under pressure, and thereby a composite magnetic sheet of a stacked structure with an increased thickness can be obtained. By repeating this method in a plurality of times, a composite magnetic sheet of a given thickness can be obtained. This pressure attaching or combining method is effective for producing a composite magnetic sheet of, particularly, a large thickness.

On the other hand, in case of using this pressure attaching method, there is a possibility that exfoliation may occur between the mutually joined two or more sheets.

Figure 4:
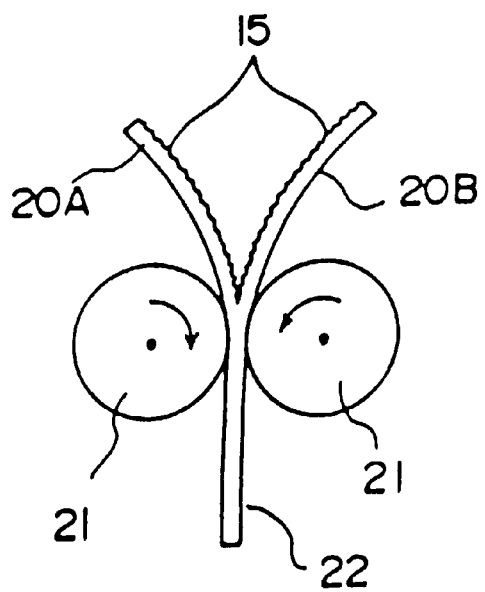
FIG. 4 is a diagram illustrating a method of producing a composite magnetic sheet of a stacked type according to a second embodiment of the present invention.

Referring to FIG. 4, it is preferable to provide in advance an uneven or grooved surface 15 to enable mutual attachment, of sheets 20A and 20B for preventing such exfoliation.

FIG. 4 is a diagram for illustrating this method.

Specifically, embossing is applied onto the surfaces of the first and second composite magnetic sheets 20A and 20B produced by the method of FIG. 1. Through this, the surfaces of the first and second composite magnetic sheets 20A and 20B are formed with an uneven surface 15 (that is, ruggedness) or grooved, respectively. Subsequently, the first and second composite magnetic sheets 20A and 20B are passed between mutually confronting two rolling rolls 21 in the state wherein they are put one over the other with their surfaces, formed with the unevenness 15, being in contact with each other. Through this, both are attached under pressure to obtain a composite magnetic sheet 22 of a stacked structure.

As described above, by providing in advance the unevened or grooved surface 15 on the surfaces of the first and second composite magnetic sheets 20A and 20B and applying the rolling process by rolling rolls 21 to the first and second composite magnetic sheets 20A and 20B while they are overlapped with each other, almost no air entrainment between the first and second composite magnetic sheets 20A and 20B is obtained. Thus, the high-quality stacked structure composite magnetic sheet 22 can be obtained, wherein the first and second composite magnetic sheets 20A and 20B are hardly exfoliated from each other.

Further, by providing the unevened surface 15 on the surfaces of the first and second composite magnetic sheets 20A and 20B, a mutual contact area between the first and second composite magnetic sheets 20A and 20B during the rolling process increases so that mutual attachment and/or joining strength are enhanced. This also makes it difficult for the first and second composite magnetic sheets 20A and 20B to be mechanically exfoliated so that the stacked structure composite magnetic sheet 22 has excellent mechanical strength.

On the other hand, the sheet 20A and/or 20B to be mutually attached in pressure is not limited to the sheet produced by the method of FIG. 1, but the sheet of the stacked structure pressure-attached by the method of FIG. 4 can be used. By this method, it is quite apparent that a sheet with a further increased thickness can be obtained.

The surfaces of the composite magnetic sheets 12 and 22 produced by the methods illustrated by FIGS. 1 and 4 are flat. Therefore, electromagnetic waves incident upon the composite magnetic sheets have some components to be reflected on those surfaces or to transmit them. For reducing the reflected components and the transmitting components, in the present invention, unevenness is formed on both sides of the composite magnetic sheet by, for example, embossing or the like. A forming method of the unevenness will be described with reference to FIG. 5.

Figure 5:
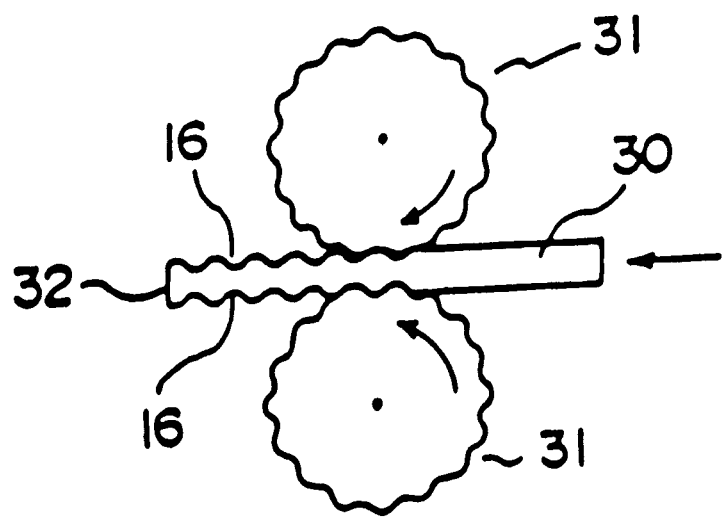
FIG. 5 is a diagram illustrating a method of producing a composite magnetic sheet having unevenness or grooves 15 on the surface thereof according to a third embodiment of the present invention.

Referring to FIG. 5, by passing the composite magnetic sheet obtained in FIG. 1 or 4 (here, collectively represented by 30) between mutually confronting first and second embossing rolls 31 and 31 such that the obverse surface and the reverse surface thereof abut the first and second embossing rolls 31 and 31, respectively, a composite magnetic sheet 32 formed with unevenness (emboss) 16 on the obverse and reverse surfaces thereof can be obtained.

Figure 6:
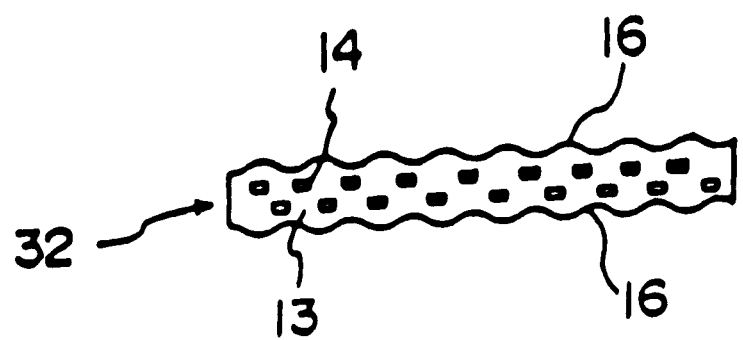
FIG. 6 is a sectional view of the composite magnetic sheet produced by the method of FIG. 5.

As shown by a sectional view of FIG. 6, in the thus produced composite magnetic sheet 32, flat soft magnetic powder 13 is dispersed in a layer 13 of an organic binding agent, and the embossed unevenness 16 is formed on both sides thereof.

Figure 7:
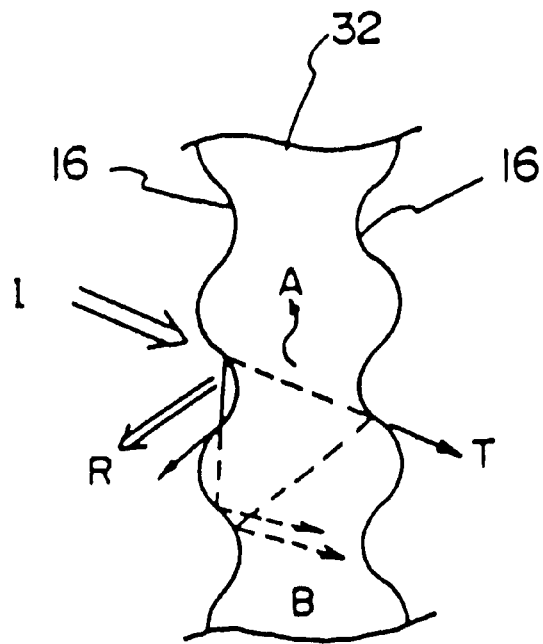
FIG. 7 is a diagram illustrating reduction of transmitting components and reflected components of electromagnetic waves of the composite magnetic sheet of FIG. 5.

Referring to FIG. 7, an electromagnetic wave I incident upon the surface of the composite magnetic sheet 32 having the unevenness or grooves 16 on the obverse and reverse surfaces thereof partly enters the composite magnetic sheet 32, while the remaining part thereof is scattered on the unevenness 16 so as to enter the composite magnetic sheet 32 from other portions of the unevenness on the surface. This reduces the reflection level of a reflected wave R. On the other hand, the electromagnetic wave entering the composite magnetic sheet 32 collides with the soft magnetic powder so as to be absorbed as an absorption loss A. The electromagnetic wave, which has reached an outgoing surface on the reverse side without collision, is scattered due to the unevenness of the surface to return into the composite magnetic sheet 32 again and subjected to multiple reflection in the interior so as to be absorbed as the absorption loss A in the course thereof. As a result, a portion of the electromagnetic wave entering the composite magnetic sheet and absorbed due to the multiple reflection in the interior is increased. As a result, the transmittance level of a transmitting wave T through the composite magnetic sheet 32 is lowered, and the reflection level of the reflected wave R is also lowered.

Therefore, by using the composite magnetic sheet 32, the undesired electromagnetic waves can be effectively absorbed.

Figure 8:
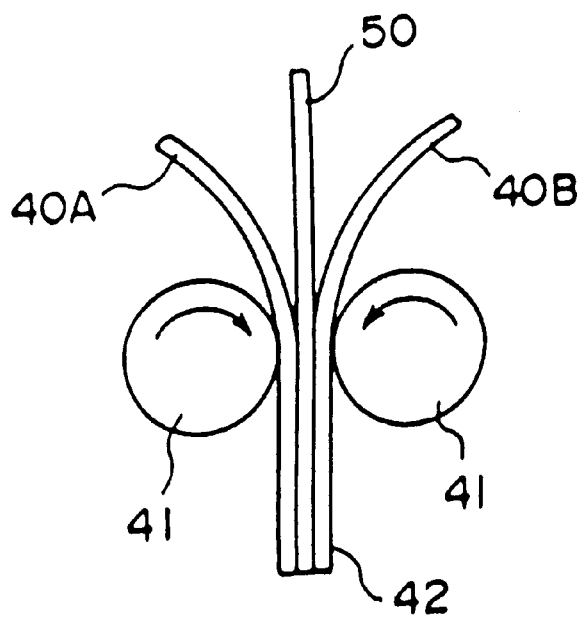
FIG. 8 is a diagram illustrating an embodiment of the method of the present invention for prodding an electromagnetic interference suppressing sheet with composite magnetic sheets and a conductor being formed into a stack.

FIG. 8 shows a method of producing an electromagnetic interference suppressing body 42 having two composite magnetic sheets 40A and 40B produced by the method of FIG. 1 or 4 and a conductor 50 which are stacked.

First, two composite magnetic bodies with a desired thickness is prepared according to the method of FIG. 1 or 4. On the other hand, as the conductive sheet 50 having a plurality of holes, an Ni-plated mesh (net) textile, for example, is prepared.

Then, in the state wherein the conductive sheet 50 is sandwiched between the two composite magnetic sheets 40A and 40B, these sheets are passed between mutually confronting two rolls 41 so as to be attached in pressure with each other. Through this, the sheet electromagnetic interference suppressing body 42 having a conductor layer (50) as a center layer and composite magnetic layers (40A and 40B), being magnetic loss layers, as surface layers can be easily obtained.

Since a conductive sheet 50 has the plurality of holes in the sheet electromagnetic interference suppressing body 42, the attaching strengths among the first composite magnetic sheet 40A, the conductive sheet 50 and the second composite magnetic sheet 40B are increased so that they mechanically resist to exfoliate from each other. Thus, the sheet of a electromagnetic interference suppressing body excellent mechanical strength is obtainable.

The conductive sheet 50 is impregnated with, for example, an adhesive for bonding said vinyl. This also improves the mutual attaching strengths between the first composite magnetic sheet 40A, the conductive sheet 50 and the second composite magnetic sheet 40B. As a result, these sheets are difficult to mechanical exfoliate one from the other. Thus a sheet of the electromagnetic interference suppressing body having excellent mechanical strength is obtainable. In this case, the adhesive used as the bond for vinyl is diluted with a lacquer reducer which is applied to the textile, that is the mesh conductive sheet 50 and dried, so as to impregnate the conductive sheet 50 with adhesive.

Alternatively, the Ni-plated textile mesh as the conductive sheet 50 may be impregnated with a thermosetting organic adhesive excellent in adhesive property relative to the organic binding agent of the first and second composite magnetic bodies 40A and 40B (that is, a soluble parameter Sp value is approximate to the organic binding agent).

The electromagnetic interference suppressing body is, for example, cut into an electromagnetic interference suppressing body piece of a desired shape upon use.

Industrial Applicability

As described above, according to the present invention, the atomized mixture of the soft magnetic powder and the organic binding agent is rolled by the mutually confronting two rolls so that mass-producible composite magnetic sheet excellent in electromagnetic wave absorption capability can be provided.

Further, since the given thickness can be achieved by reducing or increasing the thickness by repeating the rolling, the composite magnetic sheet having the desired electromagnetic wave absorption capability can be obtained.

Further, by providing the unevenness grooves on the surface of the composite magnetic sheet, there can be provided the composite magnetic sheet of the invention having excellent electromagnetic wave absorption capability accompanied by reduced reflection and permeation of electromagnetic waves.

Further, according to the present invention, there is provided a highly effective electromagnetic interference suppressing sheet excellent in blocking and absorbing the electromagnetic waves, the sheet being formed by rolling and attaching under pressure the foregoing composite magnetic sheets and the mesh metal layer.

What is claimed is:

1. A method of producing a composite magnetic sheet which comprises the steps of:

preparing a mixture of finely ground soft magnetic powder and a self-fusible organic binding agent;

rolling said powder mixture through a gap between a pair of mutually confronting rolls;

said gap being sufficient to apply a pressure to said mixture and thereby produce a composite magnetic sheet;

said organic binding agent being caused to fuse by virtue of pressure applied to said mixture;

said composite magnetic sheet in the form of a cube being characterized by a ratio Hdd/Hde of not less than about 4 between a diamagnetic field Hdd in a magnetization hard axis direction and a diamagnetic field Hde in a magnetization easy axis direction.

2. The method of producing a composite magnetic sheet as in claim 1, whereas said pair of rolls are heated to aid in the fusion of the organic binding agent during the rolling of the mixture through the gap of said pair of rolls.

3. The method as in any one of said claims 1 and 2, wherein said soft magnetic powder is comprised of flat particles which are oriented in the rolling direction.

4. The method of producing the composite magnetic sheet as recited in claim 3; wherein the particle size of the soft magnetic powder is less than the desired thickness of the composite magnetic sheet produced by said method.

5. The method of producing the composite magnetic sheet as in claim 4, wherein subsequent to said rolling step, further rolling under pressure is conducted to reduce the thickness of the sheet to the desired thickness.

6. The method of producing the composite magnetic sheet as in claim 5, which further comprises embossing grooves across each of said plurality of composite magnetic sheets prior to stacking followed by applying a pressure-attaching step to said stack of composite magnetic sheets by passing said stack through the gap of said pair of confronting rolls with the grooved surfaces in contact with each other.

7. The method of embossing said composite magnetic sheets as in claim 6, wherein said embossing is carried out by passing said composite magnetic sheet through the gap of said pair of embossing rolls, such that the obverse and reverse surface of said composite magnetic abut each of said embossing rolls, respectively.

8. A method of producing an electromagnetic interference suppressing body, wherein a conductive sheet having a plurality of spaced holes in its surface is sandwiched between two composite magnetic sheets produced in accordance with claim 7.

9. The method of producing the electromagnetic interference suppressing body as in claim 8, wherein said conductive sheet is in the form of a mesh.

10. The method of producing the electromagnetic interference body as recited in claim 9, wherein said conductive sheet is impregnated with an adhesive.

* * * * *